United States Patent
Aoki et al.

(10) Patent No.: US 12,547,074 B2
(45) Date of Patent: Feb. 10, 2026

(54) PHOTOSENSITIVE RESIN COMPOSITION, METHOD FOR PRODUCING PATTERNED CURED FILM, PATTERNED CURED FILM AND SEMICONDUCTOR ELEMENT

(71) Applicant: Showa Denko Materials Co., Ltd., Tokyo (JP)

(72) Inventors: Yu Aoki, Tokyo (JP); Yoshimi Hamano, Tokyo (JP); Teruaki Suzuki, Tokyo (JP); Masahiro Hashimoto, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 410 days.

(21) Appl. No.: 18/011,025

(22) PCT Filed: Jun. 21, 2021

(86) PCT No.: PCT/JP2021/023418
§ 371 (c)(1),
(2) Date: Dec. 16, 2022

(87) PCT Pub. No.: WO2021/261448
PCT Pub. Date: Dec. 30, 2021

(65) Prior Publication Data
US 2023/0236508 A1    Jul. 27, 2023

(30) Foreign Application Priority Data

Jun. 26, 2020  (WO) ................. PCT/JP2020/025354

(51) Int. Cl.
*G03F 7/023*   (2006.01)
*C08G 8/24*    (2006.01)
*G03F 7/039*   (2006.01)
*G03F 7/38*    (2006.01)
*G03F 7/40*    (2006.01)

(52) U.S. Cl.
CPC .............. *G03F 7/0236* (2013.01); *C08G 8/24* (2013.01); *G03F 7/0395* (2013.01); *G03F 7/38* (2013.01); *G03F 7/40* (2013.01)

(58) Field of Classification Search
CPC ........... G03F 7/023; G03F 7/38; G03F 7/0236
See application file for complete search history.

(56) References Cited

U.S. PATENT DOCUMENTS

2023/0104913 A1* 4/2023 Wang ................. G03F 7/26
                                                       430/270.1

FOREIGN PATENT DOCUMENTS

| CN | 111133382 A | 5/2020 | |
|---|---|---|---|
| EP | 4099090 A1 * | 12/2022 | ........... G03F 7/0226 |
| JP | 2007-057595 A | 3/2007 | |
| JP | 2008-309885 A | 12/2008 | |
| JP | 2014-102285 A | 6/2014 | |
| JP | 2016-024306 A | 2/2016 | |
| JP | 2018-054937 A | 4/2018 | |
| JP | 2018-111773 A | 7/2018 | |
| JP | 2018-185480 A | 11/2018 | |
| JP | 2020-094194 A | 6/2020 | |
| JP | 2024004027 A * | 1/2024 | |
| KR | 20240146553 A * | 10/2024 | ......... H01L 21/0248 |
| TW | 201922847 A | 6/2019 | |
| WO | 2010/073948 A1 | 7/2010 | |
| WO | WO-2017117343 A1 * | 7/2017 | ........... C08G 3/1007 |
| WO | 2018/021262 A1 | 2/2018 | |
| WO | 2019/065351 A1 | 4/2019 | |

OTHER PUBLICATIONS

Ho B-C et al, "Synthesis and Characteristics of Organic Soluble Photoactive Polyimides", Journal of Applied Polymer Science, John Wiley & Sons, Inc, US, vol. 53, No. 11, Sep. 12, 1994, p. 1513-p. 1524, XP000464327 (cited in a Search Report dated Aug. 8, 2023 in counterpart EP Patent Application No. 21830283.4).

Steve Lien-Chung Hsu et al, "Synthesis and characterization of a positive-working, aqueous-base-developable photosensitive polyimide precursor", Journal of Applied Polymer Science, vol. 86, No. 2, Oct. 10, 2002, p. 352-p. 358, XP055022768 (cited in a Search Report dated Aug. 8, 2023 in counterpart EP Patent Application No. 21830283.4).

Hiroshi Matsutani, Takashi Hattori, Masayuki Ohe, Takumi Ueno, Robert L. Hubbard, and Zak Fathi, "Low Temperature Curing of Polyimide Precursors by Variable Frequency Microwave", Journal of Photopolymer Science and Technology, 2005, p. 327-p. 332 (Cited in specification).

* cited by examiner

Primary Examiner — John S. Chu
(74) Attorney, Agent, or Firm — FITCH, EVEN, TABIN & FLANNERY, LLP

(57) ABSTRACT

The present disclosure relates a photosensitive resin composition containing (A) an alkali-soluble resin having an imide bond and a phenolic hydroxyl group and (B) a compound that generates acid by light, a patterned cured film using the photosensitive resin composition, a method for producing a patterned cured film, and a semiconductor element.

11 Claims, No Drawings

PHOTOSENSITIVE RESIN COMPOSITION, METHOD FOR PRODUCING PATTERNED CURED FILM, PATTERNED CURED FILM AND SEMICONDUCTOR ELEMENT

CROSS-REFERENCE TO RELATED APPLICATIONS

This application is a U.S. national phase application filed under 35 U.S.C. § 371 of International Application No. PCT/JP2021/023418, filed Jun. 21, 2021, designating the United States, which claims priority from International Application PCT/JP2020/025354, filed Jun. 26, 2020, which are incorporated herein by reference in their entirety.

TECHNICAL FIELD

The present invention relates to a photosensitive resin composition, a method for producing a patterned cured film, a patterned cured film, and a semiconductor element.

BACKGROUND ART

In recent years, along with high integration and size reduction of semiconductor elements, a surface protective layer and an interlayer insulating layer of a semiconductor element are required to have heat resistance, mechanical characteristics, adhesiveness to metal copper wiring, and the like. As a material for forming an insulating layer combining such characteristics, photosensitive resin compositions containing an alkali soluble resin have been developed (see, for example, Patent Literatures 1 to 4). When each of these photosensitive resin compositions is applied on a substrate and dried to form a resin film, and the resin film is exposed and developed, a patterned resin film (resin film having a pattern formed thereon) is obtained. Then, by heating and curing the patterned resin film, a patterned cured film (cured film having a pattern formed thereon) can be formed, and the patterned cured film can be used as a surface protective film and an interlayer insulating layer.

CITATION LIST

Patent Literature

Patent Literature 1: JP 2008-309885 A
Patent Literature 2: JP 2007-57595 A
Patent Literature 3: JP 2016-24306 A
Patent Literature 4: WO 2010/073948 A1

SUMMARY OF INVENTION

Technical Problem

A photosensitive resin composition that is used for a surface protective layer and an interlayer insulating layer is required to have fine processability concomitant with the density increase of wiring, low curing shrinkability concomitant with multilayering, and excellent mechanical strength for enhancing reliability.

It is an object of the present invention to provide a photosensitive resin composition that can form a patterned cured film having high resolution capable of fine processing and having low curing shrinkability and excellent mechanical strength.

Solution to Problem

An aspect of the present invention relates to a photosensitive resin composition containing: (A) an alkali-soluble resin having an imide bond and a phenolic hydroxyl group; and (B) a compound that generates acid by means of light.

Another aspect of the present invention relates to a method for producing a patterned cured film, the method including a step of applying and drying the above-described photosensitive resin composition on a portion or the entire surface of a substrate and forming a resin film; a step of exposing a portion or the entire surface of the resin film; a step of developing the resin film after exposure by means of an alkali aqueous solution to form a patterned resin film; and a step of heating the patterned resin film.

Another aspect of the present invention relates to a patterned cured film having a pattern, the pattern including a cured product of the above-described photosensitive resin composition. Another aspect of the present invention further relates to a semiconductor element including the above-described patterned cured film as an interlayer insulating layer or a surface protective layer.

Advantageous Effects of Invention

According to the present invention, a photosensitive resin composition that can form a patterned cured film having high resolution capable of fine processing and having low curing shrinkability and excellent mechanical strength can be provided. Furthermore, according to the present invention, a patterned cured film using the photosensitive resin composition, a method for producing the patterned cured film, a semiconductor element, and an electronic device can be provided.

DESCRIPTION OF EMBODIMENTS

Hereinafter, embodiments of the present invention will be described in detail. However, the present invention is not intended to be limited to the following embodiments. The term "(meth)acrylic acid" according to the present specification means "acrylic acid" or "methacrylic acid", and the same also applies to other similar expressions such as (meth)acrylate. According to the present specification, the term "solid content" means components of a non-volatile fraction excluding volatile substances such as water and solvents included in the photosensitive resin composition, the components being components that remain without being volatilized when the resin composition is dried and also include substances that are liquid, syrup-like, and wax-like at room temperature near 25° C.

According to the present specification, the term "step" includes not only an independent step but also a step that is not clearly distinguishable from other steps, as long as the expected action of the step is achieved. The term "layer" includes a structure having a shape formed over the entire surface as well as a structure having a shape formed in a portion, when observed as a plan view. A numerical value range represented by using the term "to" indicates a range that includes the numerical values described before and after the term "to" as the minimum value and the maximum value, respectively. With regard to a numerical value range described stepwise in the present specification, the upper limit value or lower limit value of a numerical value range of a certain stage may be replaced with the upper limit value or lower limit value of a numerical value range of another stage. With regard to a numerical value range described in the present specification, the upper limit value or lower limit value of the numerical value range may be replaced with a value indicated in the Examples.

[Photosensitive Resin Composition]

A photosensitive resin composition according to an embodiment contains: (A) an alkali-soluble resin (hereinafter, may be referred to as "component (A)") having an imide bond and a phenolic hydroxyl group; and (B) a compound generating acid by means of light (hereinafter may be referred to as "component (B)"). The photosensitive resin composition according to the present embodiment can be suitably used as a positive-type photosensitive resin composition. Hereinafter, forms of the positive-type photosensitive resin composition will be described in detail.

<Component (A): Alkali-Soluble Resin>

According to the present specification, an alkali-soluble resin means a resin that is soluble in an alkali aqueous solution (liquid developer). Incidentally, an alkali aqueous solution is an alkaline solution such as an aqueous solution of tetramethylammonium hydroxide (TMAH), an aqueous solution of a metal hydroxide, or an aqueous solution of an organic amine. Generally, an aqueous solution of TMAH having a concentration of 2.38% by mass is used for developing. Whether the component (A) is soluble in an alkali liquid developer can be checked, for example, as follows.

A coating film having a film thickness of about 5 μm is formed by spin-coating a varnish obtained by dissolving a resin in an arbitrary solvent, on a substrate such as a silicon wafer. This is immersed in any of an aqueous solution of TMAH, an aqueous solution of a metal hydroxide, or an aqueous solution of an organic amine at 20° C. to 25° C. As a result, when the coating film can uniformly dissolve, the resin can be said to be soluble in an alkali liquid developer.

The component (A) is a resin having a phenolic hydroxyl group from the viewpoints of solubility in an alkali aqueous solution, high resolution, and low curing shrinkability, and having an imide bond from the viewpoint of mechanical strength.

The phenolic hydroxyl group carried by the component (A) may be a structure derived from phenol, o-cresol, m-cresol, or p-cresol. The imide bond carried by the component (A) may be bonded to an aromatic ring.

The component (A) may be a resin having a bisphenolimide skeleton. The bisphenolimide skeleton may be a structure based on a reaction between a tetracarboxylic acid dianhydride and an aminophenol compound.

From the viewpoint of further reducing the curing shrinkage ratio and further increasing the mechanical strength, the component (A) may have a structure derived from at least one selected from the group consisting of a compound represented by the following Formula (I), a compound represented by the following Formula (II), and a compound represented by the following Formula (III), as the bisphenolimide skeleton.

[Chemical Formula 1]

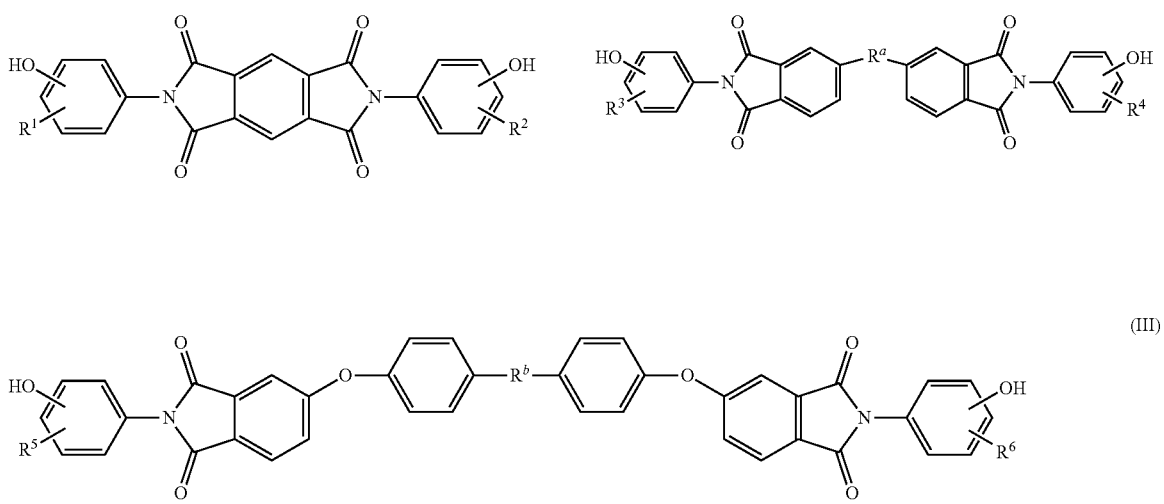

In the formulae, $R^1$, $R^2$, $R^3$, $R^4$, $R^5$, and $R^6$ each independently represent a hydrogen atom or a methyl group; and $R^a$ and $R^b$ each independently represent an ether bond, a thioether bond, a carbonyl group, an alkylene group having 1 to 3 carbon atoms, or a single bond. Examples of the alkylene group having 1 to 3 carbon atoms include a methylene group, an ethylene group, an ethylidene group, a propylene group, a propylidene group, and an isopropylidene group.

With regard to the compound represented by Formula (I), (II), or (III), from the viewpoint of increasing solubility, it is preferable that at least one of hydroxyl groups represented by OH is bonded at the meta-position or ortho-position of the imide group (imide bond).

From the viewpoint of having an excellent balance between solubility and mechanical strength, the component (A) may include a resin having a structural unit derived from a compound represented by the following Formula (1), (2), (3), (4), (5), or (6) as the bisphenolimide skeleton.

[Chemical Formula 2]

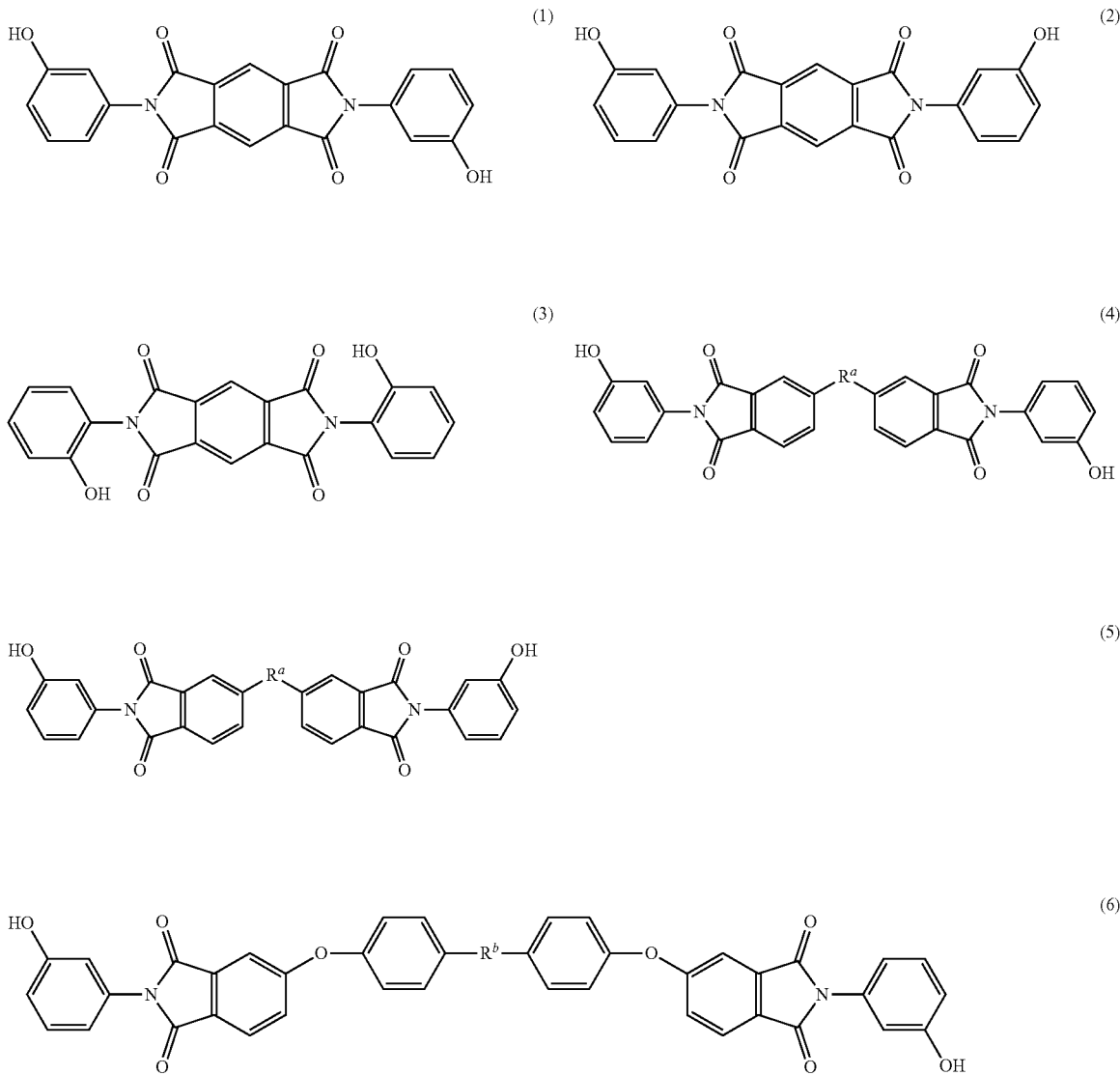

$R^a$ in Formula (4) and Formula (5) has the same meaning as $R^a$ in Formula (II), and $R^b$ in Formula (6) has the same meaning as $R^b$ in Formula (III). From the viewpoint of increasing solubility, $R^a$ is preferably an ether bond or a carbonyl group, and $R^b$ is preferably an isopropylidene group.

The component (A) may further have a structural unit derived from a cresol compound such as o-cresol, m-cresol, or p-cresol, and may further have a structural unit derived from formaldehyde, bis(methoxymethyl)biphenyl, or dimethoxymethylbenzene.

The component (A) can be synthesized, for example, according to a general synthesis method for a phenol novolac resin. The component (A) may be a reaction product between a bisphenolimide compound and a cresol compound and may also be a reaction product between a bisphenolimide compound and a cresol compound as well as formaldehyde, bis(methoxymethyl)biphenyl, or dimethoxymethylbenzene. The component (A) can have, for example, a structure represented by the following formula:

[Chemical Formula 3]

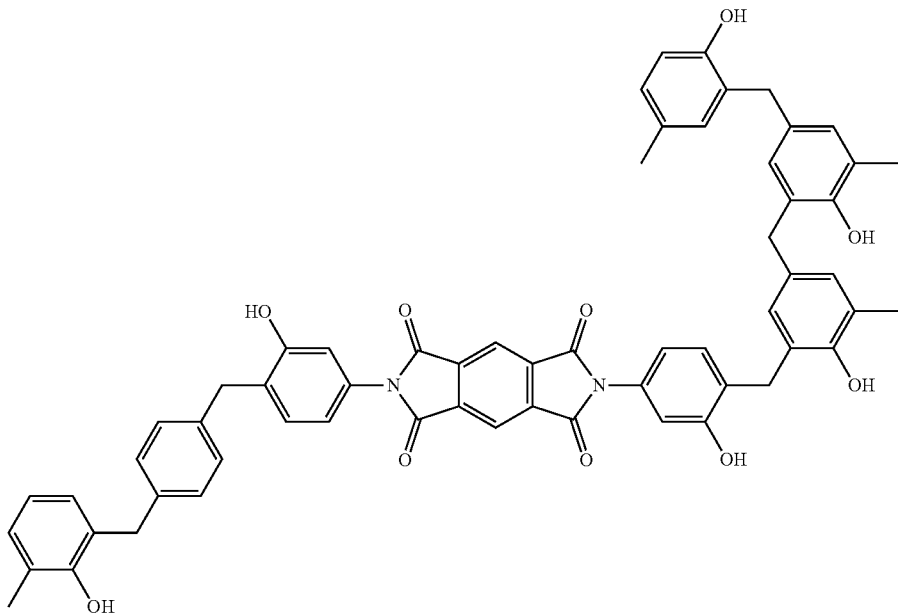

[Chemical Formula 4]

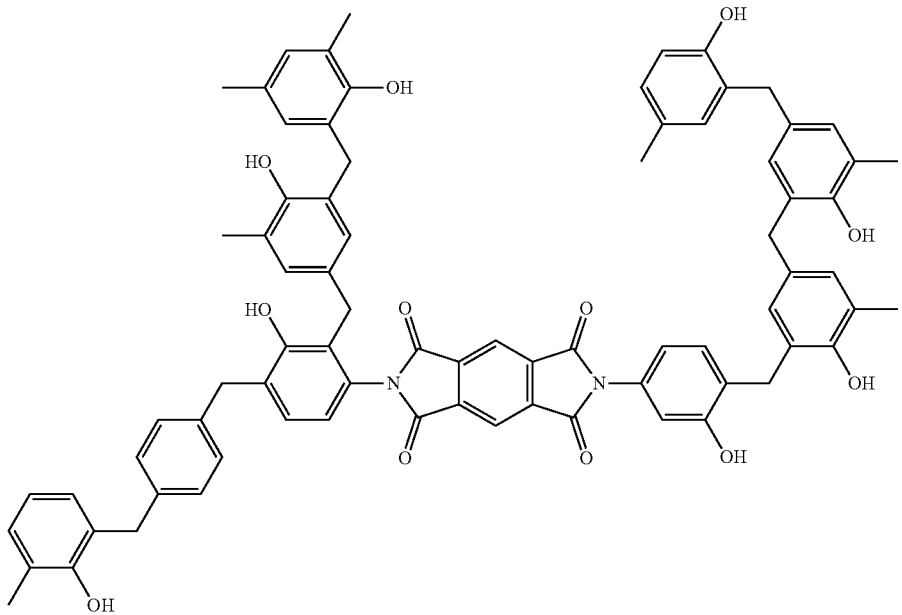

When the balance between the solubility in an alkali aqueous solution, the photosensitive characteristics, and the mechanical strength of a cured film, the weight average molecular weight (Mw) of the component (A) may be 1000 to 50000, 2000 to 45000, 3000 to 42000, 5000 to 40000, 10000 to 40000, or 15000 to 38000. Mw is a value obtainable by making measurement by a gel permeation chromatography (GPC) method and calculating the measured values relative to a standard polystyrene calibration curve.

<Component (B): Compound Generating Acid by Light>

A compound that generates acids by light (by receiving light), which is the component (B), functions as a photosensitizer for a photosensitive resin composition. The component (B) has a function of generating acid when irradiated with light and increasing the solubility of a portion that has been irradiated with light, in an alkali aqueous solution. As the component (B), a compound that is generally referred to as photoacid generator can be used. Examples of the component (B) include an o-quinone diazide compound, an aryldiazonium salt, a diaryliodonium salt, and a triarylsulfonium salt. The component (B) may be composed of only one of these compounds or may be configured to include two or more kinds thereof. Among these, from the viewpoint of having high sensitivity, the component (B) may be an o-quinone diazide compound.

Regarding the o-quinone diazide compound, for example, a product obtainable by subjecting an o-quinone diazide sulfonyl chloride and a hydroxy compound and/or an amino compound to a condensation reaction in the presence of a dehydrochloric acid agent, can be used.

Examples of o-quinone diazide sulfonyl chloride include benzoquinone-1,2-diazido-4-sulfonyl chloride, naphthoquinone-1,2-diazido-5-sulfonyl chloride, and naphthoquinone-1,2-diazido-6-sulfonyl chloride.

Examples of the hydroxy compound include hydroquinone, resorcinol, pyrogallol, bisphenol A, bis(4-hydroxyphenyl)methane, 1,1-bis(4-hydroxyphenyl)-1-[4-{1-(4-hydroxyphenyl)-1-methylethyl}phenyl]ethane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, and tris(4-hydroxyphenyl)ethane.

Examples of the amino compound include p-phenylenediamine, m-phenylenediamine, 4,4'-diaminodiphenyl ether, 4,4'-diaminodiphenylmethane, 4,4'-diaminodiphenylsulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane, and bis(4-amino-3-hydroxyphenyl)hexafluoropropane.

Among these, from the viewpoint of reactivity at the time of synthesizing an o-quinone diazide compound and from the viewpoint of having an appropriate absorption wavelength range when a resin film is exposed, the component (B) may be a condensation product of 1,1-bis(4-hydroxyphenyl)-1-[4-{1-(4-hydroxyphenyl)-1-methylethyl}phenyl]ethane and 1-naphthoquinone-2-diazido-5-sulfonyl chloride, or a condensation product of tris(4-hydroxyphenyl) methane or tris(4-hydroxyphenyl)ethane and 1-naphthoquinone-2-diazido-5-sulfonyl chloride.

Examples of the dehydrochloric acid agent include sodium carbonate, sodium hydroxide, sodium hydrogen carbonate, potassium carbonate, potassium hydroxide, trimethylamine, triethylamine, and pyridine.

Regarding the blending of o-quinone diazide sulfonyl chloride and a hydroxy compound and/or an amino compound, it is preferable that the compounds are blended such that the total number of mols of hydroxy groups and amino groups is 0.5 to 1 mol with respect to 1 mol of o-quinone diazide sulfonyl chloride. A preferred blending proportion of the dehydrochloric acid agent and o-quinone diazide sulfonyl chloride is in the range of 0.95/1 molar equivalent to 1/0.95 molar equivalent.

A preferred reaction temperature for the above-mentioned reaction is 0° C. to 40° C., and a preferred reaction time is 1 to 10 hours. Regarding the reaction solvent, for example, dioxane, acetone, methyl ethyl ketone, tetrahydrofuran, diethyl ether, or N-methylpyrrolidone is used.

From the viewpoint that the difference in the dissolution rate between an exposed part and an unexposed part becomes large, and sensitivity is further improved, the content of the component (B) may be 1 to 50 parts by mass, 3 to 35 parts by mass, or 5 to 20 parts by mass, with respect to 100 parts by mass of the component (A).

<Component (C): Thermal Crosslinking Agent>

The photosensitive resin composition of the present embodiment may further contain a thermal crosslinking agent as a component (C). The component (C) is a compound having a structure that can react with the component (A) and form a crosslinked structure when a patterned resin film is heated to be cured. As a result, brittleness of the film and melting of the film can be prevented. Examples of the component (C) include a compound having a phenolic hydroxyl group, a compound having an alkoxy group, and a compound having an epoxy group.

The "compound having a phenolic hydroxyl group" as used herein does not include the component (A). The compound having a phenolic hydroxyl group as a thermal crosslinking agent not only serves as a thermal crosslinking agent but can also increase the dissolution rate of an exposed part when developing with an alkali aqueous solution and enhance the sensitivity. The Mw of such a compound having a phenolic hydroxyl group may be 3000 or less, 2000 or less, or 1500 or less, in consideration of the balance between the solubility in an alkali aqueous solution, the photosensitive characteristics, and the mechanical strength.

Regarding the compound having an alkoxy group, conventionally known compounds can be used. Since a compound having an alkoxy group can impart high reactivity and heat resistance, the compound may have a methoxy group or may have four or more methoxy groups. In order to have an excellent balance between an effect of promoting dissolution of the exposed part and the mechanical strength of the cured film, the compound having an alkoxy group may be a compound selected from compounds represented by the following formulae:

[Chemical Formula 5]

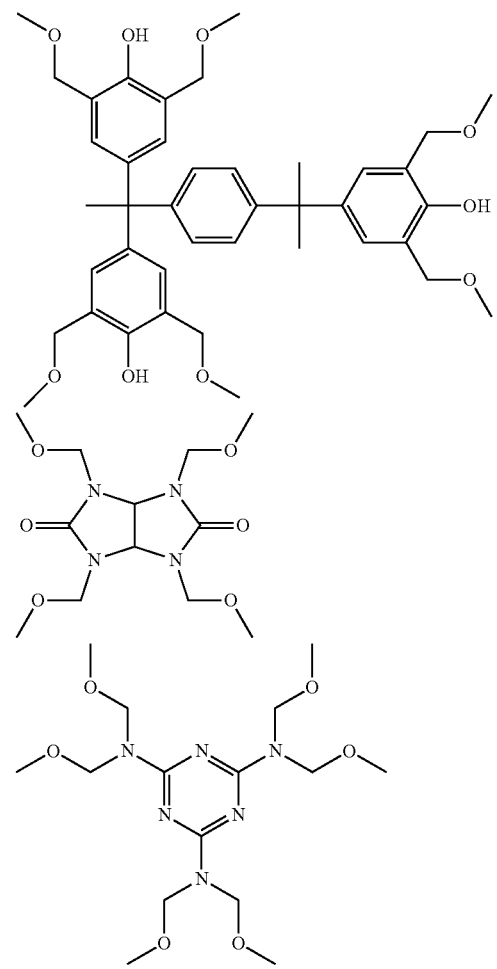

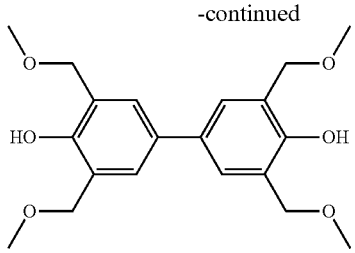

Regarding the compound having an epoxy group, conventionally known compounds can be used. Examples of the compound having an epoxy group include a bisphenol A type epoxy compound, a bisphenol F type epoxy compound, a phenol novolac type epoxy compound, a cresol novolac type epoxy compound, an alicyclic epoxy compound, a glycidyl amine type epoxy compound, a heterocyclic epoxy compound, a halogenated epoxy compound, and a polyalkylene glycol diglycidyl ether.

Regarding the component (C), besides the above-mentioned compounds, for example, an aromatic compound having a hydroxymethyl group, such as bis[3,4-bis(hydroxymethyl)phenyl] ether or 1,3,5-tris(1-hydroxy-1-methylethyl)benzene; a compound having a maleimide group, such as bis(4-maleimidophenyl)methane or 2,2-bis[4-(4'-maleimidophenoxy)phenyl]propane; a compound having a norbornene skeleton; a polyfunctional acrylate compound; a compound having an oxetanyl group; a compound having a vinyl group; or a blocked isocyanate compound can also be used.

From the viewpoints of the heat resistance of the cured film and the warpage of a coated substrate, the content of the component (C) may be 1 to 70 parts by mass, 2 to 50 parts by mass, or 3 to 40 parts by mass, with respect to 100 parts by mass of the component (A).

<Component (D): Elastomer>

From the viewpoint of enhancing the flexibility of a patterned cured film, the resin composition of the present embodiment may further contain an elastomer as the component (D). Examples of the component (D) include a styrene-based elastomer, an olefin-based elastomer, a urethane-based elastomer, a polyester-based elastomer, a polyamide-based elastomer, an acrylic elastomer, and a silicone-based elastomer. These can be used singly or in combination of two or more kinds thereof. Furthermore, it is also acceptable to introduce the skeleton of an elastomer component into the component (A).

The acrylic elastomer may have a structural unit represented by the following Formula (8). When the acrylic elastomer has a structural unit represented by the following Formula (8), since the compatibility between the component (A) and the component (D) is enhanced, cloudiness of the photosensitive resin composition can be sufficiently suppressed, the haze value of the patterned cured film can be lowered, and also, the mechanical strength can be further enhanced.

In Formula (8), $R^{17}$ represents a hydrogen atom or a methyl group; and $R^{18}$ represents a hydroxyalkyl group having 2 to 20 carbon atoms.

Examples of the hydroxyalkyl group having 2 to 20 carbon atoms represented by $R^{18}$ include a hydroxyethyl group, a hydroxypropyl group, a hydroxybutyl group, a hydroxypentyl group, a hydroxyhexyl group, a hydroxyheptyl group, a hydroxyoctyl group, a hydroxynonyl group, a hydroxydecyl group, a hydroxyundecyl group, a hydroxydodecyl group (may also be referred to as hydroxylauryl group), a hydroxytridecyl group, a hydroxytetradecyl group, a hydroxypentadecyl group, a hydroxyhexadecyl group, a hydroxyheptadecyl group, a hydroxyoctadecyl group, a hydroxynonadecyl group, and a hydroxyeicosyl group. These groups may be linear or branched.

In Formula (8), from the viewpoint that the compatibility with the component (A) and the mechanical strength can be further enhanced, $R^{18}$ is preferably a hydroxyalkyl group having 2 to 15 carbon atoms, more preferably a hydroxyalkyl group having 2 to 10 carbon atoms, and even more preferably a hydroxyalkyl group having 2 to 8 carbon atoms.

Examples of a monomer that provides a structural unit represented by Formula (8) include hydroxyethyl (meth)acrylate, hydroxypropyl (meth)acrylate, hydroxybutyl (meth)acrylate, hydroxypentyl (meth)acrylate, hydroxyhexyl (meth)acrylate, hydroxyheptyl (meth)acrylate, hydroxyoctyl (meth)acrylate, hydroxynonyl (meth)acrylate, hydroxydecyl (meth)acrylate, hydroxyundecyl (meth)acrylate, hydroxydodecyl (meth)acrylate (may also be referred to as hydroxylauryl (meth)acrylate), hydroxytridecyl (meth)acrylate, hydroxytetradecyl (meth)acrylate, hydroxypentadecyl (meth)acrylate, hydroxyhexadecyl (meth)acrylate, hydroxyheptadecyl (meth)acrylate, hydroxyoctadecyl (meth)acrylate, hydroxynonadecyl (meth)acrylate, and hydroxyeicosyl (meth)acrylate. These monomers are used singly or in combination of two or more kinds thereof.

Among these, from the viewpoint of further enhancing the compatibility with the component (A) and the breaking elongation of the cured film, it is preferable to use hydroxyethyl (meth)acrylate, hydroxypropyl (meth)acrylate, hydroxybutyl (meth)acrylate, hydroxypentyl (meth)acrylate, hydroxyhexyl (meth)acrylate, hydroxyheptyl (meth)acrylate, hydroxyoctyl (meth)acrylate, hydroxynonyl (meth)acrylate, hydroxydecyl (meth)acrylate, hydroxyundecyl (meth)acrylate, or hydroxydodecyl (meth)acrylate.

The component (D) may be an acrylic elastomer composed only of the structural unit represented by Formula (8) or may be an acrylic elastomer having a structural unit other than the structural unit represented by Formula (8). In the case of an acrylic resin having a structural unit other than the structural unit represented by Formula (8), the proportion of the structural unit represented by Formula (8) in the acrylic resin may be 0.1 mol % to 30 mol %, 0.3 mol % to 20 mol %, or 0.5 mol % to 10 mol %, with respect to the total amount of the component (D).

The acrylic elastomer may further have a structural unit represented by the following Formula (9).

[Chemical Formula 6]

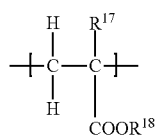

(8)

[Chemical Formula 7]

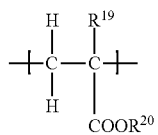

(9)

In Formula (9), $R^{19}$ represents a hydrogen atom or a methyl group; and $R^{20}$ represents a monovalent organic group having a primary, secondary, or tertiary amino group. As the component (D) has a structural unit represented by Formula (9), the dissolution inhibitory property with respect to the liquid developer at an unexposed part, and the adhesiveness to a metal substrate can be further enhanced.

Examples of a monomer that provides an acrylic elastomer having a structural unit represented by Formula (9) include aminoethyl (meth)acrylate, N-methylaminoethyl (meth)acrylate, N,N-dimethylaminoethyl (meth)acrylate, N-ethylaminoethyl (meth)acrylate, N,N-diethylaminoethyl (meth)acrylate, aminopropyl (meth)acrylate, N-methylaminopropyl (meth)acrylate, N,N-dimethylaminopropyl (meth)acrylate, N-ethylaminopropyl (meth)acrylate, N,N-diethylaminopropyl (meth)acrylate, piperidin-4-yl (meth)acrylate, 1-methylpiperidin-4-yl (meth)acrylate, 2,2,6,6-tetramethylpiperidin-4-yl (meth)acrylate, 1,2,2,6,6-pentamethylpiperidin-4-yl (meth)acrylate, (piperidin-4-yl)methyl (meth)acrylate, and 2-(piperidin-4-yl)ethyl (meth)acrylate. These monomers are used singly or in combination of two or more kinds thereof.

Among these, from the viewpoint of further enhancing the adhesiveness of the patterned cured film to a substrate and the compatibility with the component (A), it is preferable that in Formula (9), $R^{20}$ is a monovalent organic group represented by the following Formula (10).

[Chemical Formula 8]

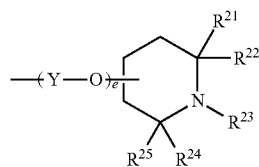

(10)

In Formula (10), Y represents an alkylene group having 1 to 5 carbon atoms; $R^{21}$, $R^{22}$, $R^{23}$, $R^{24}$, and $R^{25}$ each independently represent a hydrogen atom or an alkyl group having 1 to 20 carbon atoms; and e represents an integer from 0 to 10.

Examples of a monomer that provides a structural unit in which in Formula (9), $R^{20}$ represents a monovalent organic group represented by Formula (10), include piperidin-4-yl (meth)acrylate, 1-methylpiperidin-4-yl (meth)acrylate, 2,2,6,6-tetramethylpiperidin-4-yl (meth)acrylate, 1,2,2,6,6-pentamethylpiperidin-4-yl (meth)acrylate, (piperidin-4-yl)methyl (meth)acrylate, and 2-(piperidin-4-yl)ethyl (meth)acrylate. Among these, 1,2,2,6,6-pentamethylpiperidin-4-yl methacrylate is commercially available as FA-711MM, and 2,2,6,6-tetramethylpiperidin-4-yl methacrylate is commercially available as FA-712HM (both manufactured by Showa Denko Materials Co., Ltd. (formerly: Hitachi Chemical Co., Ltd.)), both of which are therefore preferable.

When the component (D) has a structural unit represented by Formula (10), from the viewpoints of the compatibility with the component (A) and the solubility in the liquid developer, the proportion of the structural unit represented by Formula (9) is preferably 0.3 mol % to 10 mol %, more preferably 0.4 mol % to 6 mol %, and even more preferably 0.5 mol % to 5 mol %, with respect to the total amount of the component (D).

The acrylic elastomer may further have a structural unit represented by the following Formula (11). When the acrylic elastomer has a structural unit represented by Formula (11), the thermal shock resistance of the cured film can be further enhanced.

[Chemical Formula 9]

(11)

In Formula (11), $R^{26}$ represents a hydrogen atom or a methyl group; and $R^{27}$ represents an alkyl group having 4 to 20 carbon atoms.

Examples of the alkyl group having 4 to 20 carbon atoms represented by $R^{27}$ include a butyl group, a pentyl group, a hexyl group, a heptyl group, an octyl group, a nonyl group, a decyl group, an undecyl group, a dodecyl group (may also be referred to as lauryl group), a tridecyl group, a tetradecyl group, a pentadecyl group, a hexadecyl group, a heptadecyl group, an octadecyl group, a nonadecyl group, and an eicosyl group. These groups may be linear or branched.

In Formula (11), from the viewpoints of the alkali solubility, the thermal shock resistance, and the compatibility with the component (A), $R^{27}$ is preferably an alkyl group having 4 to 16 carbon atoms, more preferably an alkyl group having 4 to 12 carbon atoms, and even more preferably an alkyl group having 4 carbon atoms (n-butyl group).

Examples of the monomer represented by Formula (11) include butyl (meth)acrylate, pentyl (meth)acrylate, hexyl (meth)acrylate, heptyl (meth)acrylate, octyl (meth)acrylate, nonyl (meth)acrylate, decyl (meth)acrylate, undecyl (meth)acrylate, dodecyl (meth)acrylate (may also be referred to as lauryl (meth)acrylate), tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, and eicosyl (meth)acrylate. These monomers are used singly or in combination of two or more kinds thereof.

Among these, from the viewpoint of further enhancing the breaking elongation and further lowering the elastic modulus, it is preferable to use butyl (meth)acrylate, pentyl (meth)acrylate, hexyl (meth)acrylate, heptyl (meth)acrylate, octyl (meth)acrylate, nonyl (meth)acrylate, decyl (meth)acrylate, undecyl (meth)acrylate, or dodecyl (meth)acrylate (also referred to as lauryl (meth)acrylate).

When the component (D) has a structural unit represented by Formula (11), the proportion of the structural unit represented by Formula (11) is preferably 50 mol % to 93 mol %, more preferably 55 mol % to 85 mol %, and even more preferably 60 mol % to 80 mol %, with respect to the total amount of the component (D). When the proportion of the structural unit represented by the above-described Formula (11) is 50 mol % to 93 mol %, the thermal shock resistance of the cured film can be further enhanced.

The acrylic elastomer may further have a structural unit represented by the following Formula (12). When the acrylic elastomer has a structural unit represented by Formula (12), the alkali solubility of an exposed part of the resin film can be further enhanced.

[Chemical Formula 10]

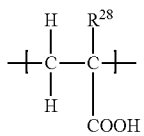
(12)

In Formula (12), $R^{28}$ represents a hydrogen atom or a methyl group.

Examples of a monomer that gives a structural unit represented by Formula (12) include acrylic acid and methacrylic acid.

When the component (D) has a structural unit represented by Formula (12), the proportion of the structural unit represented by Formula (12) is preferably 5 mol % to 35 mol %, more preferably 10 mol % to 30 mol %, and even more preferably 15 mol % to 25 mol %, with respect to the total amount of the component (D). When the composition ratio of the structural unit represented by the above-described Formula (12) is 5 mol % to 35 mol %, the compatibility with the component (A) and the alkali solubility of the exposed part can be further enhanced.

The acrylic elastomer is obtained by, for example, blending a monomer that provides a structural unit represented by the above-described Formula (8) and a monomer that provides a structural unit represented by Formula (9), (11), or (12), which is added as necessary, stirring the monomers in a solvent such as ethyl lactate, toluene, or isopropanol, and heating the mixture as necessary.

The monomers used for the synthesis of the acrylic elastomer may further include a monomer in addition to the monomers that provide structural units represented by Formula (8), (9), (11), and (12).

Examples of such a monomer include N-(meth)acryloyloxyethyl hexahydrophthalimide, 1,4-cyclohexanedimethanol mono(meth)acrylate, benzyl (meth)acrylate, 4-methylbenzyl (meth)acrylate, acrylonitrile, esters of vinyl alcohols such as vinyl-n-butyl ether, tetrahydrofurfuryl (meth)acrylate, glycidyl (meth)acrylate, 2,2,2-trifluoroethyl (meth)acrylate, 2,2,3,3-tetrafluoropropyl (meth)acrylate, α-bromo (meth)acrylic acid, α-chlor(meth)acrylic acid, β-furyl (meth)acrylic acid, β-styryl (meth)acrylic acid, maleic acid, maleic anhydride, maleic acid monoesters such as monomethyl maleate, monoethyl maleate, and monoisopropyl maleate, fumaric acid, cinnamic acid, α-cyanocinnamic acid, itaconic acid, crotonic acid, and propiolic acid. These monomers are used singly or in combination of two or more kinds thereof.

The Mw of the component (D) may be 2000 to 100000, 3000 to 60000, 5000 to 50000, or 10000 to 40000. When the Mw is 2000 or more, the thermal shock properties of the cured film can be further enhanced, and when the Mw is 100000 or less, the compatibility with the component (A) and the developability can be further enhanced. Here, the Mw is a value obtained by making measurement by a gel permeation chromatography (GPC) method and calculating the value relative to a standard polystyrene calibration curve.

From the viewpoint of the balance between the alkali solubility of an exposed part, the alkali dissolution inhibitory property of an unexposed part, the adhesiveness to a metal substrate, and the thermal shock resistance, the content of the component (D) may be 1 to 50 parts by mass, 2 to 30 parts by mass, or 3 to 20 parts by mass, with respect to 100 parts by mass of the component (A).

<Component (E): Adhesive Aid>

The photosensitive resin composition of the present embodiment may contain an adhesive aid as a component (E). By incorporating the component (E), a photosensitive resin composition that provides a patterned cured film having satisfactory adhesiveness to a substrate can be provided. The component (E) may include a nitrogen-containing aromatic compound represented by the following Formula (7).

[Chemical Formula 11]

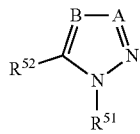
(7)

In Formula (7), $R^{51}$ represents a hydrogen atom or a hydrocarbon group; and $R^{52}$ represents a hydrogen atom, an amino group, or a phenyl group. A and B each independently represent a nitrogen atom, or a carbon atom and a hydrogen atom bonded thereto (C—H).

From the viewpoint of further enhancing the adhesiveness to a substrate, the nitrogen-containing aromatic compound represented by Formula (7) may be a nitrogen-containing aromatic compound represented by the following Formula (7a). $R^{52}$ in Formula (7a) has the same meaning as $R^{52}$ in Formula (7).

[Chemical Formula 12]

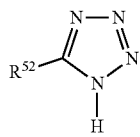
(7a)

Examples of the component (E) include 1H-tetrazole, 5-aminotetrazole, 5-phenyltetrazole, and 5-methyltetrazole. Among these, from the viewpoint of providing more satisfactory adhesiveness to the substrate, the component (E) may include 1H-tetrazole or 5-aminotetrazole.

From the viewpoint of providing satisfactory adhesiveness to a substrate and satisfactory sensitivity, the blending amount of the component (E) may be 0.01 to 20 parts by mass, 0.015 to 10 parts by mass, or 0.02 to 7 parts by mass, with respect to 100 parts by mass of the component (A).

<Other Components>

The photosensitive resin composition of the present embodiment may also contain, in addition to the above-described components (A) to (E), components such as a solvent, a compound that generates acid by heating, a dissolution accelerator, a dissolution inhibitor, a coupling agent, and a surfactant or a leveling agent.

(Solvent)

By containing a solvent, the photosensitive resin composition of the present embodiment provides an effect that application on a substrate is facilitated, and a coating film having a uniform thickness can be formed. Examples of the solvent include γ-butyrolactone, ethyl lactate, propylene glycol monomethyl ether acetate, benzyl acetate, n-butyl acetate, ethoxyethyl propionate, 3-methyl methoxypropionate, N-methyl-2-pyrrolidone, N,N-dimethylformamide, N,N-dimethylacetamide, dimethyl sulfoxide, hexamethyl phosphorylamide, tetramethylenesulfone, diethyl ketone, diisobutyl ketone, methyl amyl ketone, cyclohexanone, propylene glycol monomethyl ether, propylene glycol monopropyl ether, propylene glycol monobutyl ether, and dipropylene glycol monomethyl ether. The solvents can be used singly or in combination of two or more kinds thereof. Among these, from the viewpoints of solubility and the uniformity of the applied film, it is preferable to use ethyl lactate or γ-butyrolactone.

(Compound that Generates Acid by Heating)

By using a compound that generates acid by heating, it is possible to generate acid when the patterned resin film is heated, and the reaction between the component (A) and the component (C), that is, a thermal crosslinking reaction, is promoted so that the heat resistance of the patterned cured film is enhanced. Furthermore, since the compound that generates acid by heating generates acid also by irradiation with light, the solubility of an exposed part in an alkali aqueous solution is increased. Therefore, the difference in solubility in an alkali aqueous solution between an unexposed part and an exposed part becomes larger, and the resolution is further enhanced.

It is preferable that the compound that generates acid by heating is, for example, a compound that generates acid by heating up to 50° C. to 250° C. Examples of the compound that generates acid by heating include a salt formed from a strong acid and a base, such as an onium salt; and imide sulfonate. The content in the case of using the compound that generates acid by heating may be 0.1 to 30 parts by mass, 0.2 to 20 parts by mass, or 0.5 to 10 parts by mass, with respect to 100 parts by mass of the component (A).

(Dissolution Accelerator)

When a dissolution accelerator is blended into the above-mentioned positive-type photosensitive resin composition, the dissolution rate of the exposed part when performing developing with an alkali aqueous solution can be increased, and the sensitivity and resolution can be enhanced. Regarding the dissolution accelerator, conventionally known ones can be used. Examples of the dissolution accelerator include compounds having a carboxy group, a sulfo group, or a sulfonamide group. The content in the case of using a dissolution accelerator can be determined depending on the dissolution rate with respect to an alkali aqueous solution, and for example, the content can be adjusted to 0.01 to 30 parts by mass with respect to 100 parts by mass of the component (A).

(Dissolution Inhibitor)

A dissolution inhibitor is a compound that inhibits the solubility of the component (A) with respect to the alkali aqueous solution, and the dissolution inhibitor is used in order to control the residual film thickness, the developing time, and the contrast. Examples of the dissolution inhibitor include diphenyliodonium nitrate, bis(p-tert-butylphenyl)iodonium nitrate, diphenyliodonium bromide, diphenyliodonium chloride, and diphenyliodonium iodide. From the viewpoints of sensitivity and the allowable range of the developing time, the content in the case of using the dissolution inhibitor may be 0.01 to 20 parts by mass, 0.01 to 15 parts by mass, or 0.05 to 10 parts by mass, with respect to 100 parts by mass of the component (A).

(Coupling Agent)

When a coupling agent is blended into the photosensitive resin composition, the adhesiveness of the patterned cured film to be formed to the substrate can be further increased. Examples of the coupling agent include an organic silane compound and an aluminum chelate compound. Furthermore, examples of the organic silane compound include KBM-403, KBM-803, and KBM-903 (manufactured by Shin-Etsu Chemical Co., Ltd., trade names). The content in the case of using the coupling agent may be 0.1 to 20 parts by mass or 0.5 to 10 parts by mass with respect to 100 parts by mass of the component (A).

(Surfactant or Leveling Agent)

When a surfactant or a leveling agent is blended into the photosensitive resin composition, the coatability can be further enhanced. Specifically, for example, when a surfactant or a leveling agent is incorporated, striation (unevenness of film thickness) can be further prevented, or developability can be further enhanced. Examples of such a surfactant or leveling agent include polyoxyethylene lauryl ether, polyoxyethylene stearyl ether, polyoxyethylene oleyl ether, and polyoxyethylene octyl phenol ether. Examples of a commercially available product include MEGAFACE F-171, F-565, and RS-78 (manufactured by DIC Corporation, trade names).

The content in the case of using the surfactant or the leveling agent may be 0.001 to 5 parts by mass or 0.01 to 3 parts by mass with respect to 100 parts by mass of the component (A).

The photosensitive resin composition of the present embodiment can be developed by using an alkali aqueous solution of tetramethylammonium hydroxide (TMAH) or the like.

[Patterned Cured Film and Method for Producing Patterned Cured Film]

The patterned cured film according to an embodiment has a pattern, and the pattern includes a cured product of the above-mentioned photosensitive resin composition. The patterned cured film is obtained by heating the above-mentioned photosensitive resin composition. Hereinafter, a method for producing a patterned cured film will be described.

The method for producing a patterned cured film according to the present embodiment includes a step of applying and drying the above-mentioned photosensitive resin composition on a portion or the entire surface of a substrate and forming a resin film (application and drying (film-forming) step); a step of exposing a portion or the entire surface of the resin film (exposure step); a step of developing the resin film after exposure by means of an alkali aqueous solution to form a patterned resin film (developing step); and a step of heating the patterned resin film (heating treatment step). Hereinafter, each of the steps will be described.

(Application and Drying (Film-Forming) Step)

First, the photosensitive resin composition of the present embodiment is applied and dried on a substrate to form a resin film. In this step, the photosensitive resin composition of the present embodiment is spin-coated on a substrate such as a glass substrate, a semiconductor, a metal oxide insulator (for example, $TiO_2$ or $SiO_2$), or silicon nitride by using a spinner or the like, and a coating film is formed. The thickness of the coating film is not particularly limited; however, the thickness may be 0.1 to 40 μm. The substrate on which this coating film is formed is dried by using a hot plate, an oven, or the like. The drying temperature and the drying time are not particularly limited; however, the drying temperature and the drying time may be 80° C. to 140° C. and 1 to 7 minutes. As a result, a resin film is formed on the substrate. The thickness of the resin film is not particularly limited; however, the thickness may be 0.1 to 40 μm.

(Exposure Step)

Next, in the exposure step, the resin film formed on the substrate is irradiated with active light rays such as ultraviolet radiation, visible light, or radiation, through a mask. With regard to the photosensitive resin composition of the present embodiment, since the component (A) has high transparency to g-line, h-line, and i-line, any one or all of g-line, h-line, and i-line can be used for the irradiation.

(Developing Step)

In the developing step, the resin film is patterned by removing an exposed part of the resin film after the exposure step with a liquid developer, and a patterned resin film is obtained. Regarding the liquid developer, for example, an alkali aqueous solution of sodium carbonate, sodium hydroxide, potassium hydroxide, sodium silicate, ammonia, ethylamine, diethylamine, triethylamine, triethanolamine, or tetramethylammonium hydroxide (TMAH) is suitably used. The base concentration of such an aqueous solution may be 0.1% to 10% by mass. An alcohol or a surfactant may be added to the liquid developer for use. These may be each blended in the range of 0.01 to 10 parts by mass or 0.1 to 5 parts by mass with respect to 100 parts by mass of the liquid developer. When developing is performed by using a liquid developer, for example, the liquid developer is disposed on the resin film by a method such as shower development, spray development, immersion development, or paddle development, and the resin film is left to stand for 30 to 360 seconds under the conditions of 18° C. to 40° C. After the standing, the patterned resin film is washed by washing with water and performing spin-drying.

(Heating Treatment Step)

Next, in the heating treatment step, a patterned cured film can be formed by subjecting the patterned resin film to a heating treatment. The heating temperature in the heating treatment step may be 300° C. or lower, 270° C. or lower, or 250° C. or lower, from the viewpoint of sufficiently preventing heat-induced damage to semiconductor devices.

The heating treatment can be carried out by, for example, using an oven such as a quartz tube furnace, a hot plate, a rapid thermal annealing, a vertical diffusion furnace, an infrared curing furnace, an electron beam curing furnace, or a microwave curing furnace. Furthermore, either an air atmosphere or an inactive atmosphere of nitrogen or the like can be selected; however, a nitrogen atmosphere is desired because oxidation of the pattern can be prevented. Since the range of the above-mentioned heating temperature is lower than the conventional heating temperature, the damage to a supporting substrate and a semiconductor device can be suppressed to a low level. Therefore, an electronic device can be produced with a high yield by using the method for producing a patterned cured film according to the present embodiment. Furthermore, this leads to energy saving of the process. In addition, according to the positive-type photosensitive resin composition of the present embodiment, since the volume shrinkage (curing shrinkage) in the heating treatment step exhibited by photosensitive polyimide and the like is small, a decrease in the dimensional accuracy can be prevented.

The heating treatment time for the heating treatment step may be any length of time sufficient for the positive-type photosensitive resin composition to be cured; however, from the viewpoint of balancing with the operation efficiency, the heating treatment time is preferably approximately 5 hours or less.

In addition to the above-mentioned oven, the heating treatment can also be carried out by using a microwave curing apparatus or a variable frequency microwave curing apparatus. By using these apparatuses, only the resin film can be effectively heated while maintaining the temperature of the substrate and the semiconductor device at a desired temperature (for example, 200° C. or lower) (see J. Photopolym. Sci. Technol., 18, 327-332 (2005)).

The patterned cured film according to the present embodiment can be used as an interlayer insulating layer or a surface protective layer for a semiconductor element. A semiconductor element including an interlayer insulating layer or a surface protective layer formed from a cured film of the above-mentioned photosensitive resin composition, and an electronic device including the semiconductor element can be produced. The semiconductor element may be, for example, a memory, a package, or the like having a multilayer wiring structure, a rewiring structure, or the like. Examples of the electronic device include mobile phones, smartphones, tablet terminals, personal computers, and hard disk suspensions. By providing the patterned cured film formed by the photosensitive resin composition of the present embodiment, a semiconductor element and an electronic device having excellent reliability can be provided.

EXAMPLES

Hereinafter, the present invention will be specifically described based on Examples; however, the present invention is not intended to be limited to these.

The materials used in Examples and Comparative Examples will be described below.

(Component (A))

In order to synthesize the component (A), bisimide phenol compounds having the structures of (a1) to (a5), cresol compounds having the structures of (b1) and (b2), 1,4-bis(methoxymethyl)benzene, 4,4-bis(methoxymethyl)biphenyl, and 37% by mass formaldehyde were prepared.

Alkali-soluble resins having the structural units (molar ratio) and Mw shown in Table 1 were synthesized. (c1) is a structure that is introduced by 1,4-bis(methoxymethyl)benzene, (c2) is a structure that is introduced by 4,4-bis(methoxymethyl)biphenyl, and (c3) is a structure that is introduced by formaldehyde.

A1: Into a 1-L three-necked flask equipped with a Dean-Stark device, N,N'-bis(3-hydroxyphenyl)-pyromellitimide, o-cresol, 1,4-bis(methoxymethyl)benzene, 37% by mass formaldehyde, γ-butyrolactone, and p-toluenesulfonic acid were introduced, a reaction was carried out for 6 hours with stirring while dehydrating and removing methanol, which was a reaction side product, at 180° C., and then the reaction product was cooled to 40° C. The reaction liquid after cooling was added dropwise to 1 L of ion-exchanged water, and a precipitated resin was separated by filtration. The filtered resin was dried in a vacuum for 12 hours at 80° C. to obtain an alkali-soluble resin of (A1).

A2 to A8: Alkali-soluble resins of (A2) to (A8) were obtained by carrying out the operation in the same manner as in (A1), except that the type and the blending amounts of the compounds were changed so as to obtain the structural units shown in Table 1.

The Mw of the component (A) was deduced by making measurement by a gel permeation chromatography method (GPC) and calculating the Mw using a calibration curve of polystyrene standards. The calibration curve was approximated by a cubic equation of a universal calibration curve according to JIS K7252-2 (2016) by using five sample sets of polystyrene standards (PStQuick MP-H, PStQuick B [manufactured by Tosoh Corporation, trade names]). The conditions for GPC are shown below.

(GPC Conditions)

Detector: L-2490 RI (manufactured by Hitachi High-Technologies Corporation)

Column: Gelpack GL-R440+R450+R400M (manufactured by Hitachi High-Technologies Corporation)

Eluent: Tetrahydrofuran (THF)

Measurement temperature: 40° C.

Flow rate: 2.05 mL/min

Concentration: 5 mg/mL

TABLE 1

| Component (A) | | A1 | A2 | A3 | A4 | A5 | A6 | A7 | A8 |
|---|---|---|---|---|---|---|---|---|---|
| a1 | N,N'-bis(3-hydroxyphenyl)pyromellitimide | 10 | — | — | 10 | 10 | — | — | — |
| a2 | N,N'-bis(3-hydroxyphenyl)-4,4'-carbonyldiphthalimide | — | 10 | — | — | — | — | — | — |
| a3 | N,N'-bis(3-hydroxyphenyl)-4,4'-oxydiphthalimide | — | — | 10 | — | — | 10 | — | — |
| a4 | N,N'-bis(3-hydroxyphenyl)-bisphenol A bis(ether phthalimide) | — | — | — | — | — | — | 10 | — |
| a5 | N,N'-bis(2-hydroxyphenyl)pyromellitimide | — | — | — | — | — | — | — | 10 |
| b1 | o-cresol | 90 | 90 | 90 | 90 | 60 | 60 | 60 | 60 |
| b2 | m-cresol | — | — | — | — | 30 | 30 | 30 | 30 |
| c1 | 1,4-diethylbenzene | 40 | 40 | 40 | — | 30 | 30 | 30 | 30 |
| c2 | 4,4'-dimethylbiphenyl | — | — | — | 30 | — | — | — | — |
| c3 | isobutylene (or propylene derivative) | 60 | 60 | 60 | 70 | 70 | 70 | 70 | 70 |
| Mw | | 18900 | 18900 | 21600 | 24300 | 27000 | 35100 | 35100 | 27000 |

(Component (A'))

A'1: Cresol novolac resin (cresol/formaldehyde novolac resin, m-cresol/p-cresol (molar ratio)=60/40, Mw=12000, manufactured by Asahi Yukizai Corporation, trade name "EP4020G")

A'2: Into a 500-mL four-necked flask equipped with a thermometer, a stirrer, and a calcium chloride tube, ether diamine 4000 (manufactured by BASF SE) (0.02 mol), 1,12-diaminododecane (0.08 mol), and 150 g of N-methyl-2-pyrrolidone were introduced, and the mixture was stirred at 60° C. to obtain a uniform diamine solution. 2,2-Bis[4-(3,4-dicarboxyphenoxy)phenyl] propane dianhydride (0.1 mol) was added in small amounts to the diamine solution, and the mixture was caused to react for 1 hour at 60° C. Next, the reaction liquid was heated at 170° C. while blowing in nitrogen gas, and water was azeotropically removed with a portion of the solvent to obtain a solution of A'2, which was a polyimide resin solution.

(Component (B))

B1: 1-Naphthoquinone-2-diazide-5-sulfonic acid ester of 1,1-bis(4-hydroxyphenyl)-1-[4-{1-(4-hydroxyphenyl)-1-methylethyl}phenyl]ethane (esterification ratio about 90%, manufactured by Daito Chemix Corporation, trade name "PA28")

(Component (C))

C1: 4,4'-[1-[4-[1-[4-Hydroxy-3,5-bis(methoxymethyl) phenyl]-1-methylethyl]phenyl]ethylidene]bis[2,6-bis (methoxymethyl)phenol](manufactured by Honshu Chemical Industry Co., Ltd., trade name "HMOM-TPPA")

C2: Trifunctional epoxy-based isocyanurate (manufactured by Nissan Chemical Corporation, trade name "TEPIC-VL")

(Component (D))

D1: 55 g of ethyl lactate was weighed into a 100-mL three-necked flask equipped with a stirrer, a nitrogen inlet tube, and a thermometer, and polymerizable monomers (34.7 g of n-butyl acrylate (BA), 2.2 g of lauryl acrylate (LA), 3.9 g of acrylic acid (AA), 2.6 g of hydroxybutyl acrylate (HBA), and 1.7 g of 1,2,2,6,6-pentamethylpiperidin-4-yl methacrylate (trade name: FA-711MM, manufactured by Showa Denko Materials Co., Ltd.)), which had been weighed separately, and 0.29 g of azobisisobutyronitrile (AIBN) were added thereto. While the contents were stirred at a speed of stirring rotation of about 160 rpm at room temperature, nitrogen gas was caused to flow at a flow rate of 400 mL/min for 30 minutes to remove dissolved oxygen. Subsequently, inflow of nitrogen gas was stopped, the flask was tightly sealed, and the temperature was increased to 65° C. in about 25 minutes in a constant-temperature water tank. The same temperature was maintained for 10 hours to perform a polymerization reaction, and an acrylic resin D1 was obtained. The polymerization ratio at this time was 99%. The weight average molecular weight of D1 was about 22000. Incidentally, the molar ratio of the polymerizable monomers in D1 was as follows.

BA/LA/AA/HBA/FA711MM=69/2/20/5/4 (mol %)

(Component (E))

E1: 5-Aminotetrazole (manufactured by Toyobo Co., Ltd., trade name "HAT")

Examples 1 to 9

The components (A), (B), and (C) in the blending amounts shown in Table 2 and ethyl lactate as a solvent were blended, and this was subjected pressure filtration using a filter made of polytetrafluoroethylene and having a pore size of 0.2 μm to prepare a photosensitive resin composition.

Comparative Examples 1 to 3

Photosensitive resin compositions were prepared in the same manner as in the Examples, except that the components (A'), (B), and (C) in the blending amounts shown in Table 3 were used.

[Evaluation of Photosensitive Resin Composition]

(External Appearance)

The external appearance of a photosensitive resin composition was observed by visual inspection, and a case where the resin composition was transparent was rated as "A"; a case where the resin composition was slightly cloudy was rated as "B"; and a case where the resin composition was severely cloudy was rated as "C". When the clouding of the photosensitive resin composition is "A" or "B", a marker for alignment described on the substrate at the time of producing a semiconductor device having a patterned cured film formed by using a photosensitive resin composition can be recognized.

(Pattern Openability)

A photosensitive resin composition was spin-coated on a silicon substrate and then heated at 120° C. for 3 minutes, and a coating film having a film thickness of 7 to 9 μm was formed. Next, the coating film was subjected to reduced size projection and exposure to i-line (365 nm) by using an i-line stepper (manufactured by Canon, Inc., trade name "FPA-3000iW"), through a mask having square hole patterns from 1 μm×1 μm to 100 μm×100 μm. The exposure amount was set to 800 mJ/cm$^2$. After the exposure, developing was performed using a 2.38% aqueous solution of TMAH, the coating film was rinsed with water, and a patterned resin film was obtained. The openability of the square hole patterns of 100 μm×100 μm was evaluated according to the following criteria.

A: The pattern is opened and pattern peeling and undissolved residue of openings are not observed.

B: The pattern is open; however, pattern peeling or undissolved residue of openings can be recognized.

C: The pattern itself cannot be formed.

(Resolution)

The above-described patterned resin film was subjected to a heating treatment at a temperature of 230° C. (temperature increase 1 hour) for 2 hours in nitrogen by using an inert gas oven (manufactured by Koyo Thermo Systems Co., Ltd., trade name "INH-9CD-S"), and the resolution of the patterned cured film was evaluated. The minimum size that was open in the square hole patterns from 1 μm×1 μm to 100 μm×100 μm was used as an index for microprocessability. As the pattern size is smaller, excellent resolution is obtained, and microprocessing is enabled.

(Curing Shrinkage)

The curing shrinkage ratio was calculated by the following formula from the film thickness of the patterned resin film before curing and the film thickness of the patterned cured film after curing.

Curing shrinkage ratio (%)=[1−(film thickness of patterned cured film/film thickness of patterned resin film)]×100

(Breaking Elongation and Breaking Strength)

A photosensitive resin composition was spin-coated on a silicon substrate and heated for 4 minutes at 120° C., and a coating film having a film thickness of about 8 to 9 μm was formed. Subsequently, this coating film was subjected to exposure at a dose of 1000 MJ/cm$^2$ at all wavelengths through a mask by using a proximity exposure machine (manufactured by Canon, Inc., trade name "PLA-600FA"). After the exposure, developing was performed using a 2.38% aqueous solution of TMAH, and a resist pattern having a width of 10 mm was obtained. Subsequently, the resist pattern was subjected to a heating treatment (curing) at a temperature of 230° C. (temperature increase 1 hour) for 2 hours in nitrogen by using an inert gas oven (INH-9CD-S), and a cured film having a film thickness of about 7 μm was obtained.

The cured film was peeled off from the silicon substrate, and the breaking elongation of the peeled cured film was measured using AUTOGRAPH AGS-H100N manufactured by Shimadzu Corporation. The width of the sample was 10 mm, the film thickness was about 10 μm, and the distance between chucks was set to 20 mm. The tensile rate was set to 5 mm/min, and the measurement temperature was set to about room temperature (20° C. to 25° C.). The average from top three points of the measured values of five test specimens obtained from cured films obtained under the same conditions was taken as the breaking elongation and the breaking strength.

TABLE 2

| Component | Material | Example 1 | 2 | 3 | 4 | 5 | 6 | 7 | 8 | 9 |
|---|---|---|---|---|---|---|---|---|---|---|
| A | A1 | 100 | — | — | — | — | — | — | — | — |
|   | A2 | — | 100 | — | — | — | — | — | — | — |
|   | A3 | — | — | 100 | — | — | — | — | — | — |
|   | A4 | — | — | — | 100 | — | — | — | — | — |
|   | A5 | — | — | — | — | 100 | — | 100 | — | — |
|   | A6 | — | — | — | — | — | 100 | — | — | — |
|   | A7 | — | — | — | — | — | — | — | 100 | — |
|   | A8 | — | — | — | — | — | — | — | — | 100 |
| B | B1 | 10 | 10 | 10 | 10 | 10 | 10 | 10 | 10 | 10 |
| C | C1 | 25 | 25 | 25 | 25 | 25 | 25 | — | 25 | 25 |
|   | C2 | — | — | — | — | — | — | 25 | — | — |
| External appearance |  | A | A | A | A | A | A | A | A | A |
| Pattern openability |  | A | A | A | A | A | A | A | A | A |
| Resolution (μm) |  | 5 | 5 | 5 | 10 | 2 | 2 | 2 | 2 | 2 |
| Shrinkage ratio (%) |  | 8 | 8 | 8 | 8 | 7 | 7 | 8 | 8 | 8 |
| Breaking strength (MPa) |  | 124 | 126 | 114 | 113 | 138 | 117 | 130 | 127 | 136 |
| Breaking elongation (%) |  | 48 | 45 | 39 | 33 | 60 | 43 | 12 | 37 | 55 |

TABLE 3

| Component | Material | Comparative Example 1 | 2 | 3 |
|---|---|---|---|---|
| A' | A'1 | 100 | — | 50 |
|    | A'2 | — | 100 | 50 |
| B | B1 | 10 | 10 | 10 |
| C | C1 | 25 | 25 | 25 |
| External appearance |  | A | B | C |
| Pattern openability |  | B | C | C |
| Resolution (μm) |  | 10 | — | — |
| Shrinkage ratio (%) |  | 13 | — | — |
| Breaking strength (MPa) |  | 106 | — | — |
| Breaking elongation (%) |  | 22 | — | — |

The resin compositions of the Examples containing the component (A) could form cured films having satisfactory pattern openability and high resolution, undergoing low curing shrinkage, and having high breaking strength. On the other hand, the resin compositions of Comparative Examples 2 and 3 containing an imide resin (A'2) was not capable of pattern opening. Furthermore, with regard to the resin composition of Comparative Example 1 containing a phenol resin (A'1), pattern peeling was observed in some parts, and the curing shrinkage of the cured film was large, while the breaking strength was inferior, as compared to the resin compositions of the Examples.

Examples 10 and 11

Photosensitive resin compositions were prepared in the same manner as in Examples 1 to 9, except that the components (A) to (D) in the blending amounts shown in Table 4 were used.

Examples 12 and 13

Photosensitive resin compositions were prepared in the same manner as in Examples 1 to 9, except that the components (A) to (C) and (E) in the blending amounts shown in Table 4 were used.

(Adhesiveness)

A photosensitive resin composition was spin-coated on a copper substrate (a substrate on which TiN was formed by sputtering on a silicon substrate, and then copper was formed by sputtering on that TiN) and heated at 120° C. for 3 minutes, and a coating film having a film thickness of 10 to 11 μm was formed. Subsequently, the coating film was subjected to a heating treatment (curing) at a temperature of 230° C. (temperature increase 1 hour) for 2 hours in nitrogen by using an inert gas oven (INH-9CD-S), and a cured film having a film thickness of about 10 μm was obtained. A cross-cut test as will be described below was performed on this cured film to evaluate the adhesiveness to the copper substrate.

Eleven parallel lines each were drawn horizontally and vertically at orthogonal directions by using a cutter guide at the center of the cured film surface on the copper substrate, grid-shaped cuts were inserted so that one hundred squares were produced in 1 cm$^2$, and the cutting state was evaluated. Incidentally, for the cuts, the cutting edge of the cutter knife was kept at a constant angle in the range of 35 to 45 degrees with respect to the photosensitive film, and the cutter knife was pulled at a constant speed for 0.5 seconds for each cut such that the cutting edge would penetrate through the cured film and reach the copper substrate. As there were more squares adhering neatly to the copper substrate, it is implied that the adhesive was superior. The evaluation criteria show the results evaluated in four stages of A, B, C, and D according to the following.

A: There is no peeling at the intersections of the cuts and at the first glance of the squares, and the area of defective parts is less than 1% of the total area of squares.
B: There is slight peeling at the intersections of the cuts, there is no peeling at the first glance of the squares, and the area of defective parts is less than 5% of the total area of squares.
C: There is peeling at both sides and the intersections of the cuts, and the area of defective parts is 5% to 50% of the total area of squares.
D: The width of peeling caused by the cuts is large, and the area of defective parts is larger than 50% of the total area of squares.

TABLE 4

| Component | Material | Example 1 | 5 | 10 | 11 | 12 | 13 |
|---|---|---|---|---|---|---|---|
| A | A1 | 100 | — | 100 | — | 100 | — |
|   | A5 | — | 100 | — | 100 | — | 100 |
| B | B1 | 10 | 10 | 10 | 10 | 10 | 10 |
| C | C1 | 25 | 25 | 25 | 25 | 25 | 25 |
| D | D1 | — | — | 10 | 10 | — | — |

TABLE 4-continued

| | | Example | | | | | |
|---|---|---|---|---|---|---|---|
| Component | Material | 1 | 5 | 10 | 11 | 12 | 13 |
| E | E1 | — | — | — | — | 2 | 2 |
| Breaking strength (MPa) | | 124 | 126 | 169 | 165 | — | — |
| Breaking elongation (%) | | 48 | 45 | 70 | 66 | — | — |
| Adhesiveness | | D | D | — | — | A | A |

The photosensitive resin compositions of Examples 10 and 11 further enhanced the strength and the breaking elongation of the cured films by further containing the component (D), and the photosensitive resin compositions of Examples 12 and 13 enhanced the satisfactory adhesiveness to Cu substrates by further containing the component (E).

The invention claimed is:

1. A photosensitive resin composition comprising: (A) an alkali-soluble resin having an imide bond and a phenolic hydroxyl group; and (B) a compound that generates acid by light,
wherein the alkali-soluble resin (A) is a resin having:
a bisphenolimide skeleton derived from at least one selected from the group consisting of a compound represented by the following Formula (I), a compound represented by the following Formula (II), and a compound represented by the following Formula (III):

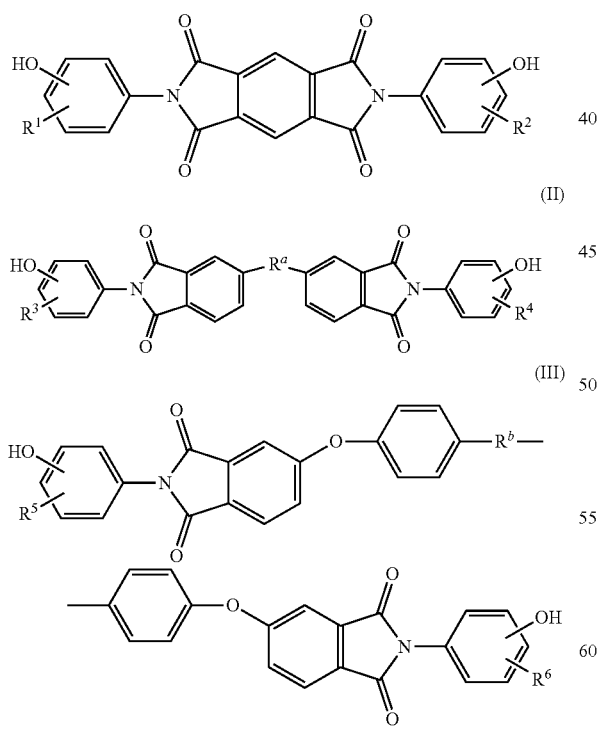

wherein R1, R2, R3, R4, R5, and R6 each independently represent a hydrogen atom or a methyl group; and Ra and Rb each independently represent an ether bond, a thioether bond, a carbonyl group, an alkylene group having 1 to 3 carbon atoms, or a single bond, and a structural unit derived from bis(methoxymethyl) biphenyl or dimethoxymethylbenzene.

2. The photosensitive resin composition according to claim 1, wherein the bisphenolimide skeleton is derived from a compound represented by the following Formula (1), (2), (3), (4), (5), or (6):

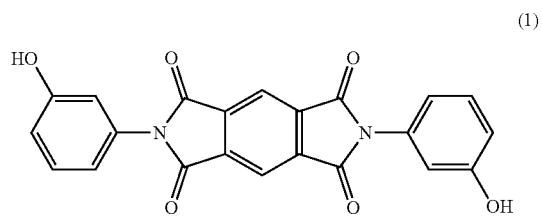

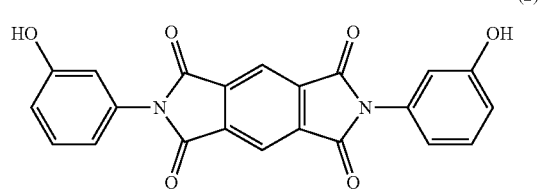

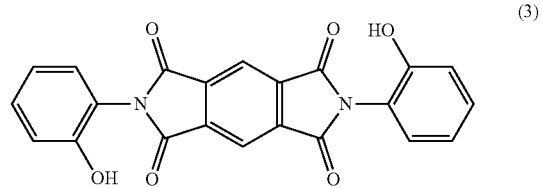

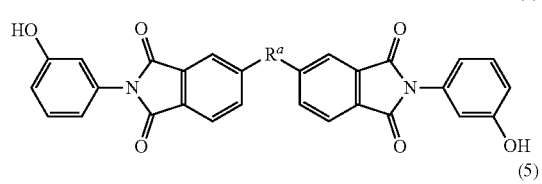

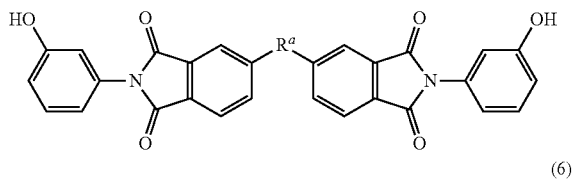

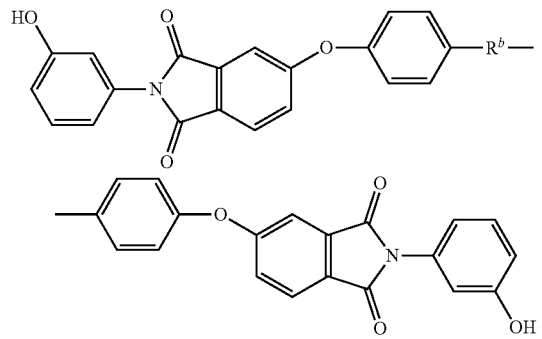

wherein Ra and Rb each independently represent an ether bond, a thioether bond, a carbonyl group, an alkylene group having 1 to 3 carbon atoms, or a single bond.

3. The photosensitive resin composition according to claim 1, wherein the compound that generates acid by light is an o-quinone diazide compound.

4. The photosensitive resin composition according to claim 1, further comprising (C) a compound capable of undergoing a crosslinking reaction by heat.

5. The photosensitive resin composition according to claim 4, wherein the compound capable of undergoing a crosslinking reaction by heat is a compound having an alkoxy group or an epoxy group.

6. The photosensitive resin composition according to claim 1, further comprising (D) an elastomer.

7. The photosensitive resin composition according to claim 1, further comprising (E) an adhesive aid.

8. The photosensitive resin composition according to claim 7, wherein the adhesive aid is a nitrogen-containing aromatic compound.

9. A method for producing a patterned cured film, the method comprising:
- a step of applying and drying the photosensitive resin composition according to claim 1 on a portion or the entire surface of a substrate and forming a resin film;
- a step of exposing a portion or the entire surface of the resin film;
- a step of developing the resin film after exposure by means of an alkali aqueous solution to form a patterned resin film; and
- a step of heating the patterned resin film.

10. A patterned cured film having a pattern, the pattern including a cured product of the photosensitive resin composition according to claim 1.

11. A semiconductor element comprising the patterned cured film according to claim 10 as an interlayer insulating layer or a surface protective layer.

* * * * *